United States Patent
Simon

(10) Patent No.: US 9,077,592 B2
(45) Date of Patent: Jul. 7, 2015

(54) LOW PHASE-NOISE INDIRECT FREQUENCY SYNTHESIZER

(75) Inventor: Herve Simon, Brest (FR)

(73) Assignee: Thales, Courbevoie (FR)

( * ) Notice: Subject to any disclaimer, the term of this patent is extended or adjusted under 35 U.S.C. 154(b) by 0 days.

(21) Appl. No.: 14/008,996

(22) PCT Filed: Mar. 20, 2012

(86) PCT No.: PCT/EP2012/054922
§ 371 (c)(1),
(2), (4) Date: Sep. 30, 2013

(87) PCT Pub. No.: WO2012/130668
PCT Pub. Date: Oct. 4, 2012

(65) Prior Publication Data
US 2014/0016727 A1    Jan. 16, 2014

(30) Foreign Application Priority Data
Mar. 31, 2011 (FR) .................................. 11 00960

(51) Int. Cl.
| H03L 7/00 | (2006.01) |
| H04L 27/148 | (2006.01) |
| H03L 7/23 | (2006.01) |
| H03L 7/185 | (2006.01) |
| H03D 7/16 | (2006.01) |

(52) U.S. Cl.
CPC ............ *H04L 27/148* (2013.01); *H03L 2207/06* (2013.01); *H03L 7/23* (2013.01); *H03D 7/161* (2013.01); *H03L 7/185* (2013.01)

(58) Field of Classification Search
CPC ........ H04W 88/06; H04W 88/02; H03B 5/04; H03B 5/1228; H03B 5/364; H03B 2201/0266; H03B 5/1215; H03B 2200/0048; H03B 5/1243; H03B 5/1262; H03B 2200/0034; H03B 5/1203; H03L 7/183; H03L 7/23; H03L 2207/06; H03L 7/185; H04L 27/148; H03D 7/161
USPC ......... 455/313, 260, 265, 258, 255, 112, 316; 331/53, 46, 42, 74; 375/298, 327
See application file for complete search history.

(56) References Cited

U.S. PATENT DOCUMENTS

| 4,061,973 | A | 12/1977 | Reimers et al. |
| 5,945,881 | A | 8/1999 | Lakshmikumar |
| 6,804,261 | B2 * | 10/2004 | Snider ........................... 370/478 |
| 2002/0070768 | A1 | 6/2002 | Mar |

FOREIGN PATENT DOCUMENTS

WO         00/19607 A1    4/2000

* cited by examiner

*Primary Examiner* — Arnold Kinkead
(74) *Attorney, Agent, or Firm* — Baker & Hostetler LLP

(57) ABSTRACT

A low phase noise frequency synthesizer includes arranged in series, a first mixer receiving a reference signal at a reference frequency $F_r$, a loop filter and a voltage-controlled oscillator delivering a microwave signal at a second frequency $F_O$ slaved to a multiple of reference frequency $F_r$, the frequency synthesizer further includes: means of multiplication of the frequency $F_O$ of the microwave signal by a factor N strictly greater than 1, means of correction of the frequency $N \cdot F_O$ of the output signal of the multiplication means to restore frequency $N \cdot F_O$ to an interval $[F_{Omin}, F_{Omax}]$ where output frequency $F_O$ would vary if multiplication factor $N=1$, means of division of the frequency $F_j$ of the output signal of the correction means by a factor equal to the expected ratio between frequency $F_j$ and reference frequency $F_r$, the frequency division means connected at output to the second input of the first mixer.

6 Claims, 4 Drawing Sheets

US 9,077,592 B2

LOW PHASE-NOISE INDIRECT FREQUENCY SYNTHESIZER

CROSS-REFERENCE TO RELATED APPLICATIONS

This application is a National Stage of International patent application PCT/EP2012/054922, filed on Mar. 20, 2012, which claims priority to foreign French patent application No. FR 1100960, filed on Mar. 31, 2011, the disclosures of which are incorporated by reference in their entirety.

FIELD OF THE INVENTION

The present invention relates to the field of the generation of microwave signals by frequency-agile synthesizers of microwave signals, and more particularly to synthesizers based on the use of a phase-locked loop to slave the microwave signal at the desired frequency to a reference signal.

BACKGROUND

The generation of a microwave signal at a desired frequency is usually implemented using a circuit with a phase-locked loop. Such a circuit makes it possible to slave the frequency of the output signal to a multiple of the frequency of the reference signal. The output frequency may thus be chosen from several values solely by modifying the frequency division value of the feedback loop. One drawback of such a circuit is that it generates significant phase noise on the output signal. In fact, the output phase noise is increased by a factor equal to the division factor of the phase loop compared with the phase noise of the reference signal.

SUMMARY OF THE INVENTION

The invention provides an indirect frequency synthesizer, based on the principle of a phase-locked loop, but enabling a considerable decrease in the phase noise affecting the output signal while conserving the switching speed of the phase-locked loop between two frequency hops and while conserving the spectral purity of the signal generated. The invention also makes it possible to improve the frequency granularity of the signal generated.

The invention may be applied advantageously in all types of systems requiring the generation of frequency-agile microwave signals of high spectral purity and low phase noise. In particular the invention applies to the generation of radar transmission signals and to the frequency synthesizers used in metrology, as well as to the clock circuits of analog-to-digital or digital-to-analog converters.

The subject of the invention is thus a frequency synthesizer, with low phase noise, containing, arranged in series, a first mixer receiving at its first input a reference signal at a reference frequency $F_r$, a loop filter and a voltage-controlled oscillator delivering at output a microwave signal at a second frequency $F_0$ and slaved to a multiple of said reference frequency $F_r$, characterized in that it also comprises:
  means of multiplication of the frequency $F_0$ of said microwave signal by a factor N strictly greater than 1,
  means of correction of the frequency $N \cdot F_0$ of the output signal of said multiplication means configured to restore this frequency $N \cdot F_0$ to an interval of variation $[F_{0min}, F_{0max}]$ in which the output frequency $F_0$ would vary if said multiplication factor N was equal to 1,
  means of division of the frequency $F_j$ of the output signal of said correction means by a factor equal to the expected ratio between said frequency $F_j$ and the reference frequency $F_r$,
  said frequency division means being connected at output to the second input of the first mixer.

In a particular aspect of the invention, the frequency correction means contain at least a second mixer, a plurality of local oscillators with low phase noise and a low-pass filter arranged in such a way that:
  the second mixer receives at a first input the output signal of said frequency multiplication means at a first frequency $N \cdot F_0$, and at a second input a signal delivered by one of said local oscillators of frequency $F_{OLk}$ configured to correct said first frequency $NF_0$ to restore it to the interval of variation $[F_{0min}, F_{0max}]$ of the output frequency $F_0$,
  said low-pass filter is configured to eliminate, in the output signal of said second mixer, the frequency components greater than the upper limit $F_{0max}$ of said interval $[F_{0min}, F_{0max}]$.

In a variant embodiment of the invention, the frequency value of the output microwave signal is obtained by the choice of one of the output signals of said local oscillators presented at the second input of said second mixer and by the choice of the frequency division value $M_j$.

In a variant embodiment of the invention, said local oscillators are local dielectric resonator oscillators.

In a variant embodiment of the invention, the frequency $F_{OLk}$ of the signals delivered by each local oscillator is determined, for k varying from 0 to N−1, by the following relationship: $F_{OLk} = (N-1) \cdot F_{0min} + k \cdot (F_{0max} - F_{0min})$ where k is equal to the integer part of the number $$N \cdot \frac{(M_i - M_1)}{(M_2 - M_1)},$$

with $M_1$ the ratio between the lowest output frequency $F_{0min}$ and the reference frequency $F_r$, $M_2$ the ratio between the highest output frequency $F_{0max}$ and the reference frequency $F_r$, and $M_i$ the ratio between the desired output frequency $F_0$ and the reference frequency $F_r$.

In a variant embodiment of the invention, the division factor $M_j$ of the means (208) is determined using the following relationship $M_j = N \cdot M_i - [(N-1) \cdot M_1 + k \cdot (M_2 - M_1)]$.

BRIEF DESCRIPTION OF THE DRAWINGS

Other features and advantages of the invention will appear in the following description, made with reference to the appended drawings which represent.

DETAILED DESCRIPTION

Figure 1:
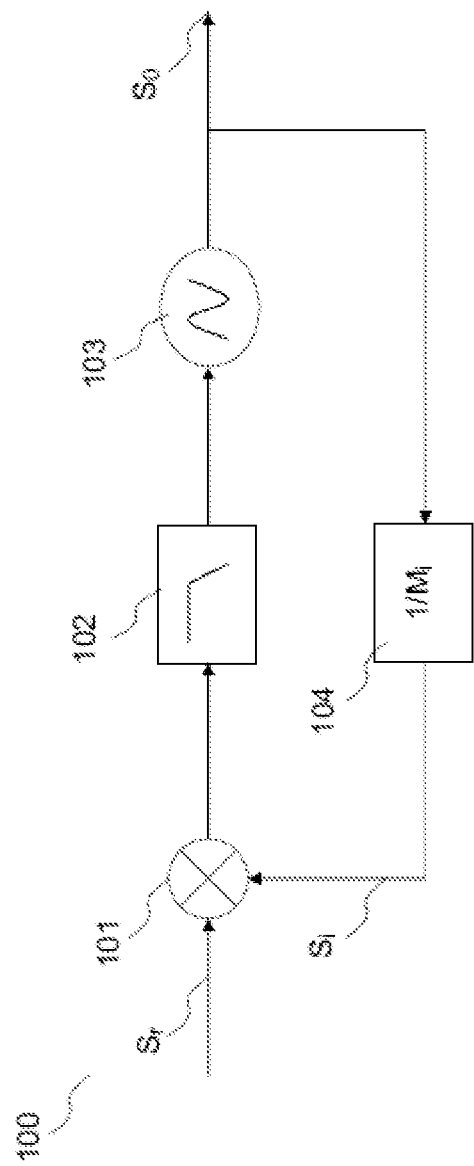
FIG. 1, a block diagram of a phase-locked loop according to the prior art,
  FIG. 2, a block diagram of the indirect frequency synthesizer device according to the invention,
  FIG. 3, a diagram illustrating the determination of the frequency correction value introduced into the feedback loop of the device according to the invention,
  FIG. 4, an illustration of the decrease in the phase noise on the microwave signal generated by comparing the performance of the known solutions and that of the invention.

FIG. 1 illustrates by a block diagram the principle of a phase-locked loop 100 enabling the slaving of a microwave signal $S_0$ of frequency $F_0$ to a multiple of the frequency $F_r$ of a reference signal $S_r$.

The reference signal $S_r$ is compared by way of a mixer 101 to a signal $S_i$ resulting from the frequency division 104 of the output microwave signal $S_O$ by a factor $M_i$. The signal produced at the output of the mixer 101 contains the information on the error, of phase or of frequency, between the two signals it receives at input. This output signal is then filtered 102, and supplied as input to a voltage-controlled local oscillator 103 that produces at its output the microwave signal $S_O$ of which the frequency is equal to the frequency $F_r$ of the reference signal that the factor $M_i$ multiplies. The assembly composed of the mixer 101 and of the filter 102 performs the function of comparator of the phase or the frequency between the reference signal $S_r$ and the signal $S_i$. The closed-loop operation guarantees a convergence of the system toward an output signal of which the frequency is such that the phase/frequency error at the mixer 101 output is approximately nil, or as close to nil as component defects will allow.

Thus, by varying the value $M_i$ of the frequency division 104, it is possible to choose the frequency of the output signal $S_O$ from an interval of values $[F_{0min}, F_{0max}] = [M_1 F_r, M_2 F_r]$ The phase noise, expressed in dBc/Hz, affecting the output signal $S_O$, in the frequency band equal to the band of the loop filter 102, is equal to $\theta_O = \theta_{ref} + 20 \cdot \log(F_0/F_r) = \theta_{ref} + 20 \cdot \log(M_i)$ where $\theta_{ref}$ represents the sum of the phase noises of the reference signal and of the mixer 101. The term phase noise is used here with reference to the power spectral density relative to the signal power. When the frequency $F_0$ is high with respect to the reference frequency $F_r$, the integrated phase noise of the microwave signal $S_O$ becomes substantial. Generally speaking, the phase noise of the output signal is increased by the factor $M_i$, compared to that of the reference frequency. The only way of reducing the phase noise then consists in increasing the frequency of the reference signal. However, such a modification is in most cases undesirable because it requires the changing of the reference signal generator circuit, most commonly a quartz oscillator, as well as of the frequency divider 104. Moreover, the increase of the reference frequency also introduces the drawback of an increase in the granularity of the frequency resolution of the output signal.

Figure 2:
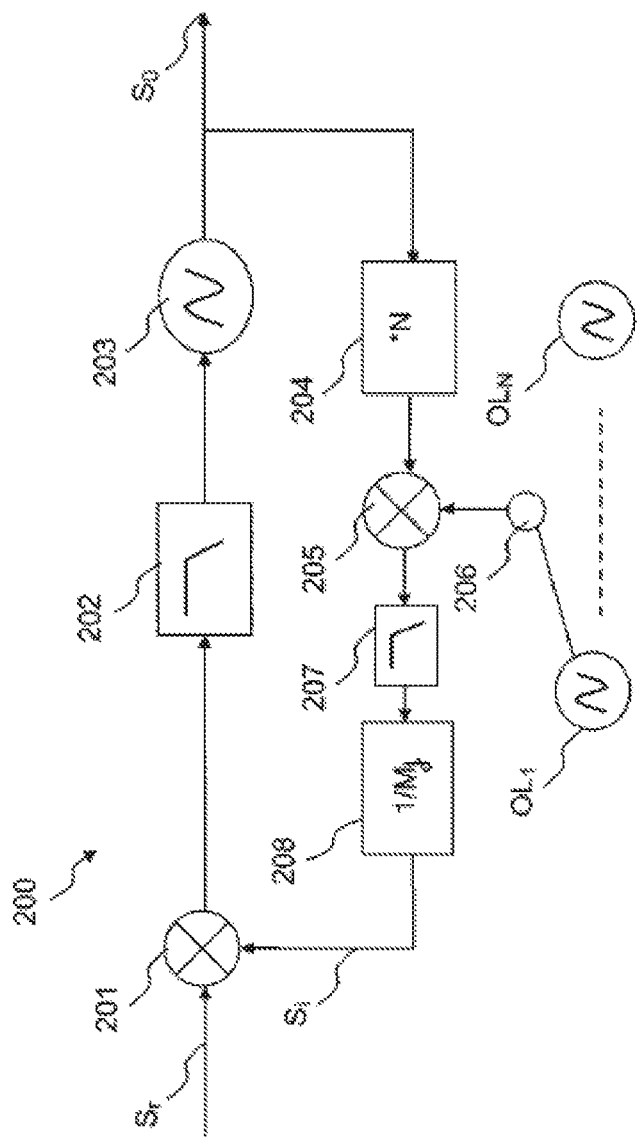

FIG. 2 illustrates by a block diagram the indirect frequency synthesizer device 200 according to the invention.

The device 200 receives as input a reference signal $S_r$ of frequency $F_r$. The reference signal $S_r$ is compared, by means of a mixer 201, to a signal $S_i$ output by the feedback path of the looped system 200 according to the invention. The signal resulting from the comparison of the signals $S_r$ and $S_i$ is then filtered by means of a loop filter 202 and presented as input to a voltage-controlled local oscillator 203. The microwave signal $S_O$ at the desired frequency $F_0$, a multiple of the frequency $F_r$ of the reference signal, is obtained at the output of the local oscillator 203 that delivers a signal of frequency proportional to the voltage applied at its input. The assembly composed of the mixer 201 and of the filter 202 carries out the function of comparator of the phase or frequency between the reference signal $S_r$ and the signal $S_i$.

Part of the power of the microwave signal $S_O$ is then sampled and injected as input to a frequency multiplier 204 which produces as output a signal with frequency $F_0$ multiplied by a factor N. A mixer circuit 205 is connected at a first input to the output of the multiplier 204 and at a second input to a switch 206, itself connected to one of N low phase noise local oscillators $OL_1, OL_k, OL_N$. Each of said local oscillators $OL_k$ delivers a signal with a frequency $F_{OLk}$ predetermined as a function of the frequency $F_0$ of the microwave signal generated, as well as of the interval of variations $[F_{0min}, F_{0max}]$ of this frequency. Said local oscillators $OL_k$ are, for example, DROs (Dielectric Resonator Oscillators) or PDROs (Phase locked Dielectric Resonator Oscillators).

The output signal of the mixer 205 contains at least one component at a frequency equal to the difference between the frequencies of the two signals applied to its input. This output signal is applied as input to a low-pass filter 207 with a cut-off frequency equal to $F_{0max}$ in order to retain only the useful frequency component and to filter the component corresponding to the sum of the frequencies of the two input signals. It is then frequency-divided by a factor $M_j$ by a divider 208, then applied to the second input of the mixer 201.

One of the aims of the device 200 according to the invention consists in limiting the phase noise $\theta_O$ on the output signal $S_O$, without modifying the frequency of the reference signal $S_r$, or the values of the frequency divider 208 of the feedback loop. The introduction of the multiplier 204 makes it possible to reduce by a factor N the phase noise $\theta_O$, which is then equal to $\theta_O = (M_i/N) \theta_{ref}$.

However, the introduction of the multiplier 204 changes the operation of a conventional phase-locked loop and it is appropriate to modify it to carry out the prime desired function, namely the synthesis of a microwave signal $S_O$ at a frequency $F_0$ that is a multiple, by a factor $M_i$, of the reference frequency $F_r$ and frequency-adjustable within an interval of variations $[F_{0min}, F_{0max}] = [M_1 \cdot F_r, M_2 \cdot F_r]$. In fact, the introduction of the multiplier 204 has the effect of increasing by a same factor the loop gain of the synthesizer. To correct this phenomenon, it is necessary to correct the frequency of the output signal of the multiplier 204. The correction frequency $F_{OLk}$ is determined in such a way as to restore the frequency of the output signal of the mixer 205 to the interval of variations $[F_{0min}, F_{0max}]$ expected by the divider 208 provided for conventional operation of the state of the art before the invention, i.e. when the multiplier 204 is absent or when the multiplication factor N is equal to 1.

Figure 3:
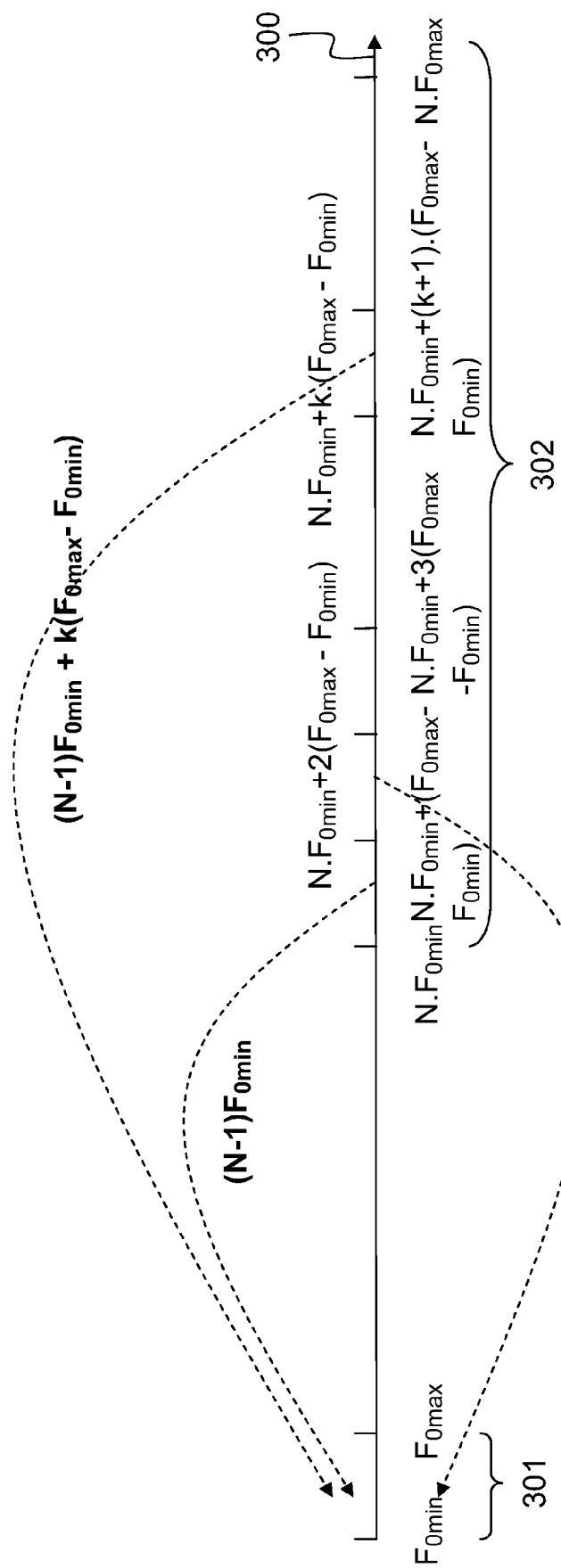

FIG. 3 illustrates by a diagram an example of determining the correction frequency $F_{OLk}$. On the frequency axis 300 is shown, firstly, the interval 301 of variation of the frequency of the microwave signal $S_O$ generated, and secondly the interval 302 of variation of the frequency of the output signal of the multiplier 204 itself decomposed into sub-intervals of identical width equal to the width $F_{0max} - F_{0min}$ of the interval 301. The output signal of the frequency multiplier 204, of frequency $F_i = N \cdot M_i \cdot F_r$, included in the interval $[N \cdot F_{0min} + k \cdot (F_{0max} - F_{0min}); N \cdot F_{0min} + (k+1) \cdot (F_{0max} - F_{0min})]$, must be corrected by a frequency $F_{OLk} = (N-1) \cdot F_{0min} + k \cdot (F_{0max} - F_{0min})$ as illustrated by FIG. 3.

Thus, a signal of frequency $F_{OLk}$ is generated for each value of k varying from 0 to N−1, by a separate local oscillator with low phase noise.

The output signal of the mixer 205 will by virtue of its construction have a frequency $F_j$ lying within the interval 301 of variation of the output microwave signal $S_O$.

The value of k is determined using the following relationship:

$$k = E\left[N \cdot \frac{(M_i - M_1)}{(M_2 - M_1)}\right], \text{ with } M_1 = F_{0min}/F_r \text{ and } M_2 = F_{0max}/F_r.$$

A frequency division 208 of a value $M_j = N \cdot M_i - [(N-1) \cdot M_1 + k \cdot (M_2 - M_1)]$ is then applied to retrieve a signal, at the input of the phase comparator 201, of frequency substantially identical to the reference frequency $F_r$ in the steady state. In the transient state, the frequency $F_j$ of the output signal of the mixer 205 tends gradually toward the product of the value of the division factor $M_j$ and the reference frequency $F_r$. In the steady state, this value becomes substantially equal to the ratio of the division factor value $M_j$ and the reference frequency $F_r$.

The advantages of the invention are numerous when compared with known solutions.

First of all, the resultant phase noise on the generated microwave signal $S_0$ is reduced by a factor N with respect to a conventional phase-locked loop as described in FIG. 1.

Figure 4:
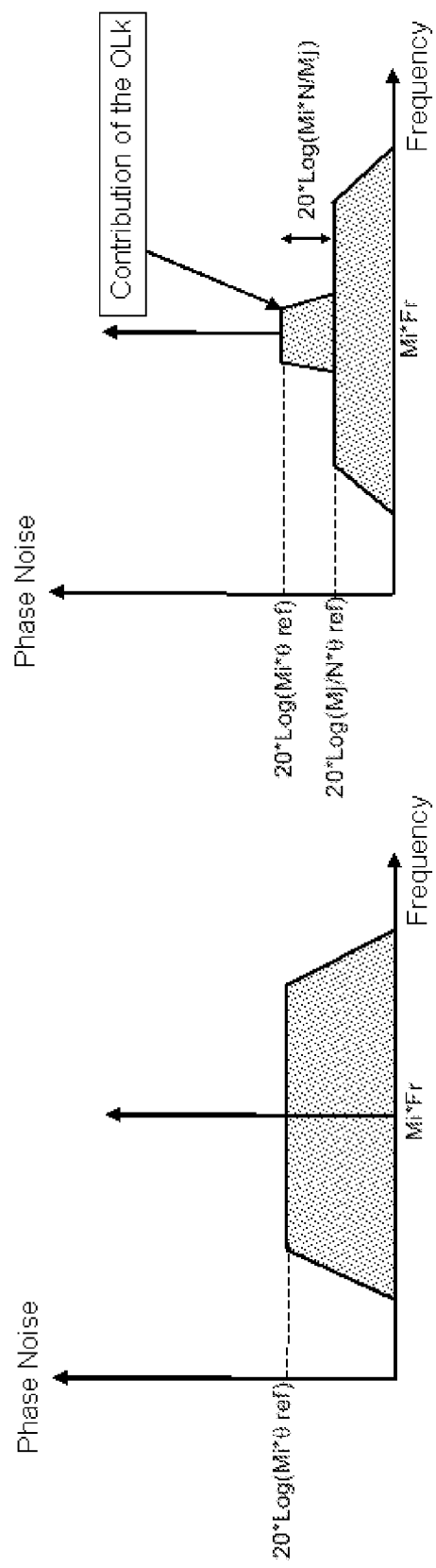

FIG. 4 illustrates by two diagrams the phase noise generated on the output microwave signal of the device as a function of the bandwidth of the loop filter 102, 202.

The left-hand part of FIG. 4 represents the phase noise obtained for a conventional phase-locked loop. It is substantially equal to $20 \cdot \log(M_i \cdot \theta_r)$ over the whole band of the loop filter 102, $M_i$ being the division factor of the loop and $\theta_r$ the phase noise of the reference signal.

The right-hand part of FIG. 4 represents the phase noise obtained using the device according to the invention. It is decreased by a factor N over the whole frequency band under consideration except in a narrow band around the frequency $F_0$ of the generated signal, which corresponds to the loop band of the local oscillators $OL_k$, typically of a width equal to a hundredth of the width of the loop band of the device.

The phase noise affecting the microwave signal is thus decreased in a very large part of the loop band of the device according to the invention.

The invention also has the advantage of not generating additional intermodulation spurs caused by the introduction of the second mixer 205. In fact, these are filtered by the loop filter 202 and it is thus not necessary to implement a bandpass filtering at the output of the second mixer 205; a simple low-pass filter 207 is enough to eliminate the frequency component output from the mixer 205 which corresponds to the sum of the input frequencies.

The invention also has the additional advantage of improving the frequency resolution of the microwave signal generated. In fact, the step between two possible generated frequencies becomes equal to $F_r/N$ instead of $F_r$ for a conventional phase-locked loop.

The invention claimed is:

1. A frequency synthesizer, with low phase noise, including, arranged in series, a first mixer receiving at its first input a reference signal at a reference frequency $F_r$, a loop filter and a voltage-controlled oscillator delivering at output a microwave signal at a second frequency $F_0$ slaved to a multiple of said reference frequency $F_r$, the frequency synthesizer further comprising:

a frequency multiplier configured to multiply the frequency $F_0$ of said microwave signal by a factor N strictly greater than 1, a frequency corrector configured to correct the frequency $N \cdot F_0$ of the output signal of said frequency multiplier configured to restore this frequency $N \cdot F_0$ to an interval $[F_{0min}, F_{0max}]$ in which said output frequency $F_0$ would vary if said multiplication factor N was equal to 1, a frequency divider configured to divide the frequency $F_j$ of the output signal of said frequency corrector by a factor equal to the expected ratio between said frequency $F_j$ and the reference frequency $F_r$, said frequency divider being connected at output to the second input of the first mixer.

2. The frequency synthesizer of claim 1, wherein the frequency corrector comprises at least a second mixer, and a plurality of local oscillators with low phase noise and a low-pass filter arranged in such a way that:

the second mixer receives at a first input the output signal from said frequency multiplier at a first frequency $N \cdot F_0$, and at a second input a signal delivered by one of said local oscillators of frequency $F_{OLk}$ configured to correct said first frequency $N \cdot F_0$ to restore it to the interval of variation $[F_{0min}, F_{0max}]$ of the output frequency $F_0$, said low-pass filter is configured to eliminate, in the output signal of said second mixer, the frequency components greater than the upper limit $F_{0max}$ of said interval $[F_{0min}, F_{0max}]$.

3. The frequency synthesizer of claim 2, wherein the frequency value of the output microwave signal is obtained by the choice of one of the output signals of said local oscillators presented at the second input of said second mixer and by the choice of the frequency division value $M_j$.

4. The frequency synthesizer of claim 2, wherein said local oscillators ($OL_k$) are local dielectric resonator oscillators.

5. The frequency synthesizer of claim 2, wherein the frequency $F_{OLk}$ of the signals delivered by each local oscillator is determined, for k varying from 0 to N−1, by the following relationship: $F_{OLk}=(N\times 1) \cdot F_{0min}+k \cdot (F_{0max}-F_{0min})$ where k is equal to the integer part of the number $$N \cdot \frac{(M_i - M_1)}{(M_2 - M_1)},$$

with $M_1$ the ratio between the lowest output frequency $F_{0min}$ and the reference frequency $F_r$, $M_2$ the ratio between the highest output frequency $F_{0max}$ and the reference frequency $F_r$, and $M_i$ the ratio between the desired output frequency $F_0$ and the reference frequency $F_r$.

6. The frequency synthesizer of claim 5, wherein the frequency division value $M_j$ of said frequency divider is determined using the following relationship $M_j=N \cdot M_i-[(N-1) \cdot M_1+k \cdot (M_2-M_1)]$.

* * * * *

UNITED STATES PATENT AND TRADEMARK OFFICE
CERTIFICATE OF CORRECTION

PATENT NO. : 9,077,592 B2
APPLICATION NO. : 14/008996
DATED : July 7, 2015
INVENTOR(S) : Herve Simon It is certified that error appears in the above-identified patent and that said Letters Patent is hereby corrected as shown below:

In the claims:

In line 4 of claim 5, "$F_{OLk} = (N \times 1) \cdot F_{0min} + k \cdot (F_{0max} - F_{0min})$," should read --$F_{OLk} = (N-1) \cdot F_{0min} + k \cdot (F_{0max} - F_{0min})$--.

Signed and Sealed this
Seventeenth Day of November, 2015

Michelle K. Lee
*Director of the United States Patent and Trademark Office*